(12) United States Patent
Yasuda

(10) Patent No.: US 7,499,119 B2
(45) Date of Patent: Mar. 3, 2009

(54) LIQUID-CRYSTAL DISPLAY DEVICE WITH THIN-FILM TRANSISTORS AND METHOD OF FABRICATING THE SAME

(75) Inventor: Kyounei Yasuda, Kanagawa (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 240 days.

(21) Appl. No.: 11/582,315

(22) Filed: Oct. 18, 2006

(65) Prior Publication Data

US 2007/0085118 A1    Apr. 19, 2007

(30) Foreign Application Priority Data

Oct. 19, 2005  (JP) .............................. 2005-304134

(51) Int. Cl.
*G02F 1/136* (2006.01)
(52) U.S. Cl. ......................................... 349/43; 349/42
(58) Field of Classification Search ....................... None
See application file for complete search history.

(56) References Cited

U.S. PATENT DOCUMENTS 6,750,475 B1 * 6/2004 Izumi et al. .................... 257/59

FOREIGN PATENT DOCUMENTS

| JP | 11-064887 | 3/1999 |
|----|-----------|--------|
| JP | 2004-006936 | 1/2004 |
| KR | 2002-0030487 | 4/2002 |

OTHER PUBLICATIONS

Chinese Office Action dated Aug. 29, 2008 with English-Language Translation.

* cited by examiner

*Primary Examiner*—Sung H Pak
(74) *Attorney, Agent, or Firm*—McGinn IP Law Group, PLLC

(57) ABSTRACT

A LCD device prevents corrosion of the transparent conductive layers and contact resistance increase without arising the step coverage degradation due to the thickness increase of the interconnection layer, the step coverage degradation due to the formation of undercut portions, and productivity reduction and fabrication cost increase. A first interconnection line comprising a patterned Al or Al alloy layer is disposed on or over an insulating plate. A first insulating layer is formed to cover the first interconnection line to have a contact hole exposing a part of the first interconnection line. A first conductive material made of a plated metal is in contact with the exposed part of the first interconnection line in the contact hole. A first transparent conductive layer is in contact with the first conductive material. The first transparent conductive layer is electrically connected to the first interconnection line by way of the first conductive material.

22 Claims, 5 Drawing Sheets

LIQUID-CRYSTAL DISPLAY DEVICE WITH THIN-FILM TRANSISTORS AND METHOD OF FABRICATING THE SAME

BACKGROUND OF THE INVENTION

1. Field of the Invention

The present invention relates to a Liquid-Crystal Display (LCD) device with Thin-Film Transistors (TFTs) and a method of fabricating the same. More particularly, the invention relates to a LCD device having wiring or interconnection lines made of aluminum (Al) or Al alloy and a layer or layers (a transparent conductive layer or layers) made of a transparent conductive material such as Indium Tin Oxide (ITO) electrically connected to the interconnection lines, and a method of fabricating the LCD device.

2. Description of the Related Art

In recent years, the LCD device has been extensively used as high-resolution displays. Generally, the LCD device comprises a substrate on which switching elements such as TFTs are arranged, which may be termed a "TFT substrates" below; an opposite substrate on which a color filter, a black matrix or the like are formed; and a liquid crystal layer located between the TFT substrate and the opposite substrate. The amount of transmitting light in the respective pixels is controlled by changing the alignment direction of the liquid-crystal molecules with the electric field generated between the electrodes on the TFT substrate and those on the opposite substrate or between the electrodes on the TFT substrate, thereby displaying images on the screen of the LCD device. On the TFT substrate, various wiring or interconnection lines such as gate electrode lines (i.e., scanning lines), drain electrode lines (i.e., signal lines), and common electrode lines are formed in a matrix array. At the ends of these interconnection lines, gate electrode input terminals, drain electrode input terminals, and common electrode input terminals, or the like are formed. These interconnection lines are electrically connected to external driver circuit elements with these terminals. The external driver circuit elements are attached to the TFT substrate by the known TAB (Tape Automated Bonding) method or the like.

With the LCD device having the above-described configuration, the length of the above-described interconnection lines increases as the device enlarges and therefore, their electric resistance (which may be simply termed "resistance" below) increases. Since the resistance increase of the said interconnection lines causes transmission delay of electric signals, the display quality degradation is likely to arise. Moreover, higher density and higher aperture ratio are required for the recent LCD device and thus, the said lines need to be narrowed. If the said lines are narrowed, however, their resistance will increase and thus, the display quality will degrade due to the transmission delay of signals. Accordingly, conventionally, Al has been used to form the said lines, because Al is one of the known low-resistance interconnection materials.

However, the standard electrode potential of Al is largely apart from that of a typical transparent conductive material (e.g., ITO) to be used for the pixel electrodes or the like. Therefore, there is a problem that corrosion is likely to occur in the transparent conductive material due to electrochemical reaction caused by the developing or etching solution used for patterning the transparent conductive layer. In addition, when an Al layer and a transparent conductive material are directly connected to each other, oxygen (O) atoms are likely to be drawn out of the transparent conductive material. In this case, an aluminum oxide ($Al_2O_3$) layer with an insulating property is formed at the interface between the Al layer and the transparent conductive material, arising another problem that the contact resistance between them increases.

To solve the above-described two problems, i.e., "corrosion of the transparent conductive layer" and "contact resistance increase at the interface", conventionally, the following two-layered and three-layered structures have been developed and disclosed for the interconnection lines.

The conventional two-layered structure of the interconnection line comprises an Al layer and a conductive barrier layer (an upper barrier layer) made of tungsten (W) or the like stacked on the Al layer. The conventional three-layered structure of the interconnection line comprises an Al layer, a conductive barrier layer (an upper barrier layer) made of W or the like stacked on the Al layer, and another conductive layer (a lower barrier layer) made of W or the like stacked beneath the Al layer. An example of the interconnection line including the two- and three-layered structures is shown in FIG. 1.

FIG. 1 schematically shows the configuration of a conventional LCD device with TFTs. In FIG. 1, the structures of a transistor section including one of the TFTs, the terminal section of a gate electrode line (i.e., a gate terminal section) connected to the gate electrode of the TFT, and a terminal section of a drain electrode line (i.e., a drain terminal section) connected to the drain electrode of the TFT are shown.

As shown in FIG. 1, gate electrodes 121 and gate electrode lines 122 are formed on a glass plate 101. Each of the gate electrodes 121 is formed by a patterned Al alloy layer 102 and a patterned upper barrier metal layer 111 stacked thereon to have a two-layer structure. Each of the gate electrode lines 122 has the same two-layer structure as the gate electrode 121. The gate electrode lines 122, which are united with the corresponding gate electrodes 121, extend to the corresponding gate terminal sections. The gate electrodes 121 and the gate electrode lines 122 are covered with a gate insulating layer 103 that covers the whole surface of the glass plate 101. The gate insulating layer 103 comprises contact holes 133 in the respective gate terminal sections to expose corresponding parts of the underlying gate electrode lines 122.

In each of the transistor sections, an island-shaped amorphous silicon layer (which will be abbreviated as an "a-Si layer" below) 104 is formed on the gate insulating layer 103 so as to overlap with each of the gate electrodes 121. The a-Si layer 104 is a conductive layer to generate a channel therein. A pair of island-shaped, $n^+$-type a-Si layers 105a and 105b are formed on the a-Si layer 104 to be apart from each other at a predetermined distance. A source electrode 123 and a drain electrode 124 are formed on the $n^+$-type a-Si layers 105a and 105b, respectively. The $n^+$-type a-Si layers 105a and 105b are conductive layers for improving the ohmic contact of the overlying source and drain electrodes 123 and 124 with the underlying a-Si layer 104. The source and drain electrodes 123 and 124 are located on the gate insulating layer 103 in the areas excluding the positions superposed on the $n^+$-type a-Si layers 105a and 105b.

The source electrode 123 has a three-level or three-layer structure comprising a patterned lower barrier metal layer 106, a patterned Al alloy layer 107 stacked on the lower barrier metal layer 106, and a patterned upper barrier metal layer 112 stacked on the Al alloy layer 107. The drain electrode 124 has the same three-layer structure as the source electrode 123. The drain electrode lines 125, which are formed on the gate insulating layer 103, have the same three-layer structure as the drain electrode 124.

The source electrodes 123, the drain electrodes 124, and the drain electrode lines 125 are covered with a passivation insulating layer 108 formed over the whole surface of the glass plate 101. The passivation insulating layer 108 enters the respective gaps between the source electrodes 123 and the corresponding drain electrodes 124.

Transparent conductive layers 110a, 110b, and 110c, which are formed by a patterned ITO layer, are located on the passivation insulating layer 108. These layers 110a, 110b, and 110c are respectively contacted with the underlying drain electrode 124, the underlying gate electrode line 122, and the underlying drain electrode line 125 by way of the corresponding contact holes penetrating through the passivation insulating layer 108 and/or the gate insulating layer 103.

Specifically, the transparent conductive layer 110a located in each of the transistor sections is in contact with the upper barrier metal layer 112 constituting the upper part of the corresponding drain electrode 124 by way of the corresponding contact hole 131 of the passivation insulating layer 108. The transparent conductive layer 110b located in each of the gate terminal sections is in contact with the upper barrier metal layer 112 constituting the upper part of the corresponding gate electrode line 122 by way of the corresponding contact hole 132 of the passivation insulating layer 108 and the corresponding contact hole 133 of the gate insulating layer 103. The transparent conductive layer 110c located in each of the drain terminal sections is in contact with the upper barrier metal layer 112 constituting the upper part of the corresponding drain electrode line 125 by way of the corresponding contact hole 134 of the passivation insulating layer 108.

As explained above, with the conventional interconnection structure shown in FIG. 1, the transparent conductive layers 110a, 110b, and 110c are not in direct contact with the Al alloy layer 107 of the drain electrode 124, the Al alloy layer 102 of the gate electrode line 122, and the Al alloy layer 107 of the drain electrode line 125. Therefore, electrochemical reaction due to the developing or etching solution in the patterning process of the ITO layer for forming the transparent conductive layers 110a, 110b, and 110c is suppressed. Moreover, since the upper barrier metal layer 111 or 112 intervenes between the transparent conductive layers 110a, 110b, and 110c and the corresponding Al alloy layer 102 or 107, the contact resistance between the layers 110a, 110b, and 110c and the corresponding layer 102 or 107 does not increase.

However, the above-described conventional structure of the interconnection lines has several disadvantages. These disadvantages for the conventional three-layer structure are the same as those for the conventional two-layer structure and therefore, only those for the conventional two-layer structure will be referred to in the following explanation.

The first disadvantage is the step coverage degradation of an overlying layer or layers located on or over the interconnection lines. With the conventional two-layer structure, since the upper barrier metal layer 111 or 112 is stacked on the Al alloy layer 102 or 107, the thickness of the gate electrode lines 122 and the drain electrode lines 125 (i.e., interconnection lines) increases by a value corresponding to the thickness of the upper barrier metal layer 111 or 112. As a result, the step coverage of an overlying layer or layers located on or over the gate electrode lines 122 and the drain electrode lines 125 will degrade.

The second disadvantage is the possibility that the step coverage of an overlying layer or layers located on or over the interconnection lines degrades conspicuously. With the conventional two-layer structure, when the upper barrier metal layer 111 or 112 and the Al alloy layer 102 or 107 are subject to wet etching in a lump to form the said two-layer structure, the Al alloy layer 102 or 107 alone are side-etched. Therefore, undercut portions are formed under the upper barrier metal layer 111 or 112. Due to the undercut portions, the step coverage of the overlying layer or layers may deteriorate.

The third disadvantage is the productivity reduction and fabrication cost increase. With the conventional two-layer structure, to form the upper barrier metal layer 111 or 112, a reaction or process chamber for the CVD or sputtering process needs to be prepared. This reduces the productivity and as a result, the fabrication cost increases.

Accordingly, techniques that solve the problems of "corrosion of the transparent conductive layers" and "contact resistance increase" without the above-described first to third disadvantages is desired. Conventionally, various techniques have ever been developed and disclosed to meet the requirement.

For example, with the TFT-type LCD device disclosed in the Japanese Non-Examined Patent Publication No. 11-64887 published in 1999, a contact hole is formed in an insulating layer that covers an Al interconnection layer in such a way that the contact hole reaches the surface of the Al interconnection layer. On the insulating layer and the inner wall of the contact hole, an ITO layer (i.e., a transparent conductive layer) is formed. Moreover, a silicide layer is formed to intervene between the ITO layer and the Al interconnection layer at the bottom of the contact hole.

With the prior-art structure of the Publication No. 11-64887, because of the intervening silicide layer between the ITO layer and the Al interconnection layer, the contact-resistance increase due to direct contact of the ITO layer with the Al interconnection layer is suppressed. Moreover, since the silicide layer is formed only at the bottom of the contact hole of the Insulating layer, it is sufficient that the insulating layer covers the Al interconnection layer alone. This means that the step coverage of the insulating layer is improved. Moreover, since the depth of the contact hole is decreased by a value corresponding to the thickness of the silicide layer formed at the bottom of the said contact hole, the step coverage of the ITO layer is improved as well. Furthermore, since the interconnection lines are formed by only the Al interconnection layer, it is sufficient that a single etching process is carried out. This means that the patterning processes for the interconnection lines are easily conducted. (Refer to claim 1, paragraphs 0005 and 0006, and FIG. 1 of this Publication.)

The Japanese Non-Examined Patent Publication No. 2004-6936 published in 2004 discloses a TFT substrate. With this substrate, a gate electrode is formed by a first metal layer and a second metal layer (i.e., a capping layer) stacked on the first metal layer, where the first metal layer is formed on a transparent plate. A gate pad is formed by the second metal layer. An insulating layer is formed on the plate to selectively expose a part of the second metal layer. A patterned semiconductor layer is formed on the insulating layer to be superposed on the gate electrode. A source electrode and a drain electrode are formed on the semiconductor layer. A patterned protection layer is formed to have a contact hole exposing the drain electrode and a contact hole exposing the second metal layer of the gate pad. A first patterned pixel electrode is formed on the protection layer to be in contact with the drain electrode. A second patterned pixel electrode is formed on the protection layer to be in contact with the second metal layer of the gate pad. The first metal layer is made of, for example, Al or Al alloy. The second metal layer is made of, for example, Cr, Mo, Ta or Ti. The second pixel electrode is made of, for example, ITO. (Refer to claims 1 to 3, paragraphs 0012 to 0014, and FIG. 11 of this Publication.)

With the TFT substrate disclosed in the Publication No. 2004-6936, the gate electrode is formed to have a two-layer structure comprising an Al or Al alloy layer (i.e., the first metal layer) and a refractory metal layer made of Cr, Mo, Ta or Ti (i.e., the second metal layer). Therefore, cell reaction (i.e., electrochemical reaction) due to direct contact of the Al layer with the ITO layer is prevented and at the same time, the formation of hillocks is prevented. Moreover, an anodic oxidation process can be omitted with the second metal layer (i.e., the capping layer), and the insulating layer and the protection layer can be etched simultaneously and therefore, the count of necessary photolithography processes can be reduced. Furthermore, since the size of the first metal layer can be approximately the same as or larger than the second metal layer, the gate electrode has no undercut portion. Accordingly, the insulating characteristic deterioration of the insulating layer due to the step coverage degradation in the deposition process of the insulating layer after the formation of the gate electrode can be prevented.

However, the above-described techniques disclosed by the Japanese Publication Nos. 11-64887 and 2004-6936 have the following disadvantages.

Specifically, with the LCD device disclosed in the Publication No. 11-64887, after the formation of the Al layer, the silicide layer needs to be formed by a CVD or sputtering method necessitating the heating of the glass plate. Therefore, it is required to prepare a plasma-enhanced CVD apparatus or a sputtering apparatus and a sputtering target. Thus, a disadvantage that the fabrication cost of the LCD device increases by the cost for preparing the CVD apparatus or the sputtering apparatus and the target occurs. In addition, there is another disadvantage that the formation process of the silicide layer accelerates or promotes the formation of hillocks and/or voids of the Al layer due to thermal history.

With the above-described TFT substrate disclosed in the Publication No. 2004-6936, the gate electrode has the two-layer structure comprising the Al or Al alloy layer (i.e., the first metal layer) and the refractory metal layer made of Cr, Mo, Ta or Ti (i.e., the second metal layer). This means that the gate electrode line has the same two-layer structure as the gate electrode, because the gate electrode line is formed by the same patterned metal layers as the gate electrode. Therefore, there are the same disadvantages as those of the conventional interconnection structure shown in FIG. 1.

SUMMARY OF THE INVENTION

Accordingly, an object of the present invention is to provide a LCD device that solves the previously-described two problems of "corrosion of the transparent conductive layers" and "contact resistance increases" without arising the above-described first to third disadvantages (i.e. the step coverage degradation due to the thickness increase of the interconnection line itself, the step coverage degradation due to the formation of undercut portions, and productivity reduction and fabrication cost increase), and a method of fabricating the LCD device.

Another object of the present invention is to provide a LCD device that Improves the reliability of the gate terminal section and the drain terminal section that are likely to be exposed to severe environments, and a method of fabricating the LCD device.

The above objects together with others not specifically mentioned will become clear to those skilled in the art from the following description.

According to a first aspect of the present invention, a LCD device is provided, which comprises a first interconnection line comprising a patterned Al or Al alloy layer, disposed directly on an insulating plate or over the plate by way of an underlying insulating layer;

a first insulating layer formed on the plate to cover the first interconnection line, the first insulating layer having a contact hole that exposes a part of the first interconnection line;

a first conductive material made of a plated metal, the first conductive material being in contact with the exposed part of the first interconnection line in the contact hole in such a way as to cover the whole exposed part thereof; and a first transparent conductive layer in contact with the first conductive material;

wherein the first transparent conductive layer is electrically connected to the first interconnection line by way of the first conductive material.

With the LCD device according to the first aspect of the present invention, the first interconnection line comprising a patterned Al or Al alloy layer is provided. The first interconnection line, which is disposed directly on the insulating plate or over the plate by way of the underlying insulating layer, is covered with the first insulating layer. The first insulating layer has the contact hole that exposes the part of the first interconnection line. In the said contact hole, the whole exposed part of the first interconnection line is covered with the first conductive material made of a plated metal (i.e., a metal deposited by a plating method). The first transparent conductive layer is in contact with the first conductive material, thereby electrically connecting the first transparent conductive layer to the first interconnection line by way of the first conductive material.

Accordingly, in the patterning process of the first transparent conductive layer, the first transparent conductive layer is not affected by the developing or etching solution, because the developing or etching solution is not contacted with the first interconnection line formed by the patterned Al or Al alloy layer. This means that the problem of "corrosion of the transparent conductive layers" is solved. Since the first transparent conductive layer is not in direct contact with the first interconnection line, the problem of "contact resistance increase" is solved as well.

Moreover, the first conductive material is in contact with the exposed part of the first interconnection line in the contact hole of the first insulating layer in such a way as to cover the whole exposed part and thus, the first insulating layer covers the first interconnection line alone. Therefore, the LCD device according to the first aspect of the invention is apparently different from the conventional interconnection structure shown in FIG. 1 comprising the upper barrier metal layer stacked on the whole surface of the patterned Al or Al alloy layer, and the insulating layer that covers both of the Al or Al alloy layer and the upper barrier metal layer. As a result, the above-described first disadvantage of "the step coverage degradation due to the thickness increase of the interconnection line itself" does not occur.

Because of the similar reason as above, it is only the first interconnection line to be patterned by etching, and the first conductive material necessitates no etching or patterning process. Therefore, the above-described second disadvantage of "the step coverage degradation due to the generation of undercut portions" does not occur as well.

Furthermore, since the first conductive material is made of a plated metal, any reaction or process chamber for CVD or sputtering is not necessary to form the said first conductive material. Thus, the third disadvantage of "the productivity reduction and fabrication cost increase" does not arise.

In addition, it is preferred for the invention that the first interconnection line is formed by a patterned Al or Al alloy layer alone: in other words, the first interconnection line has a single-layer structure. However, a two-layer structure comprising a patterned Al or Al alloy layer and a patterned conductive layer stacked beneath the Al or Al alloy layer may be used for the first interconnection line, where the patterned conductive layer is located nearer the plate than the patterned Al or Al alloy layer. A three- or more-layer structure comprising a patterned Al or Al alloy layer and a patterned conductive layer stacked beneath the Al or Al alloy layer may be used for the first interconnection line, where the patterned conductive layer is located nearer the plate than the patterned Al or Al alloy layer.

In a preferred embodiment of the LCD device according to the first aspect of the present invention, the first conductive material is disposed only in the contact hole of the first insulating layer. In this embodiment, the first transparent conductive layer is raised by the first conductive material in the contact hole by the height corresponding to the thickness of the first conductive material. The first conductive material is not disposed on the first insulating layer. Thus, there is an additional advantage that the step coverage of the first transparent conductive layer (and an overlying layer or layers formed on the first transparent conductive layer) is improved. Although this additional advantage is obtainable even when the first interconnection line is a drain electrode line, it is conspicuous when the first interconnection line is a gate electrode line. This is because the distance of the gate electrode line from the first transparent conductive layer is greater than that of the drain electrode line from the first transparent conductive layer and therefore, the difference in level of the gate electrode line is larger than that of the drain electrode line.

In another preferred embodiment of the LCD device according to the first aspect of the present invention, the first conductive material is less in width than the first interconnection line. Moreover, a bottom of the first conductive material is preferably in a same plane as that of the contact hole.

In still another preferred embodiment of the LCD device according to the first aspect of the present invention, the first conductive material is one selected from the group consisting of Ni, Ag, Au and Cr. This is because these metals have a good corrosion resistant property against the applicable environment of the said LCD device and can be deposited by a plating method. However, any other metal may be used for the present invention.

In a further preferred embodiment of the LCD device according to the first aspect of the present invention, the following (a) to (e) are additionally provided.

(a) A second interconnection line formed by a patterned Al or Al alloy layer, disposed on the first insulating layer;

(b) a second insulating layer formed on the first insulating layer to cover the second interconnection line, the second insulating layer having a contact hole that exposes a part of the second interconnection line;

(c) a second conductive material made of a plated metal, the second conductive material being in contact with the exposed part of the second interconnection line in the contact hole of the second insulating layer in such a way as to cover the whole exposed part thereof;

(d) a second transparent conductive layer in contact with the second conductive material: and (e) the second transparent conductive layer being electrically connected to the second interconnection line by way of the second conductive material.

In this embodiment, it is preferred that the first interconnection line is a gate electrode line and the second interconnection line is a drain electrode line. In this case, there is an additional advantage that the step coverage of the first and second transparent conductive layers is improved with respect to both the gate and drain electrode lines.

In a still further preferred embodiment of the LCD device according to the first aspect of the present invention, the second conductive material is one selected from the group consisting of Ni, Ag, Au and Cr.

According to a second aspect of the present invention, a method of fabricating the LCD device according to the first aspect of the present invention is provided. This method comprises the steps of:

forming an Al or Al alloy layer directly on an insulating plate or over the plate by way of an underlying insulating layer;

patterning the Al or Al alloy layer to form a first interconnection line;

forming a first insulating layer on the plate to cover the first interconnection line;

selectively etching the first insulating layer to form a contact hole that exposes a part of the first interconnection line;

depositing a metal in the contact hole of the first insulating layer by a plating method, thereby forming a first conductive material in contact with the exposed part of the first interconnection line in such a way as to cover the whole exposed part thereof: and forming a first transparent conductive layer on the first conductive material to be in contact therewith, thereby electrically connecting the first transparent conductive layer to the first interconnection line by way of the first conductive material.

With the method of fabricating a LCD device according to the second aspect of the present invention, the Al or Al alloy layer is formed directly on the insulating plate or over the plate by way of the underlying insulating layer and then, the Al or Al alloy layer is patterned to form the first interconnection line. Next, the first insulating layer is formed on the plate to cover the first interconnection line and the first insulating layer is selectively etched to form the contact hole that exposes the part of the first interconnection line. Thereafter, the metal is deposited in the contact hole of the first insulating layer by a plating method, thereby forming the first conductive material in contact with the exposed part of the first interconnection line in such a way as to cover the whole exposed part. Finally, the first transparent conductive layer is formed on the first conductive material to be in contact therewith. Thus, the first transparent conductive layer is electrically connected to the first interconnection line by way of the first conductive material. Accordingly, it is apparent that the LCD device according to the first aspect of the invention is fabricated.

In a preferred embodiment of the method according to the second aspect of the present invention, the first conductive material is disposed only in the contact hole of the first insulating layer.

In another preferred embodiment of the method according to the second aspect of the present invention, a gate electrode line is formed by the first interconnection layer.

In still another preferred embodiment of the method according to the second aspect of the present invention, the first conductive material is less in width than the first interconnection line.

In a further preferred embodiment of the method according to the second aspect of the present invention, the first conductive material is one selected from the group consisting of Ni, Ag, Au and Cr.

In a still further preferred embodiment of the method according to the second aspect of the present invention, an electrolytic plating method is used as the plating method.

In a still further preferred embodiment of the method according to the second aspect of the present invention, the following steps (a') to (e') are additionally included.

(a') Forming a second interconnection line on the first insulating layer by a patterned Al or Al alloy layer;

(b') forming a second insulating layer on the first insulating layer to cover the second interconnection line;

(c') selectively etching the second insulating layer to have a contact hole that exposes a part of the second interconnection line;

(d') depositing a metal in the contact hole of the second insulating layer by a plating method, thereby forming a second conductive material to be in contact with the exposed part of the second interconnection line in the contact hole in such a way as to cover the whole exposed part thereof: and (e') forming a second transparent conductive layer on the second conductive material to be in contact therewith, thereby electrically connecting the second transparent conductive layer to the second interconnection line by way of the second conductive material.

In this embodiment, it is preferred that the first interconnection line is a gate electrode line and the second interconnection line is a drain electrode line. In this case, there is an additional advantage that the step coverage of the first and second conductive materials is improved with respect to the gate and drain electrode lines.

In a still further preferred embodiment of the method according to the second aspect of the present invention, the second conductive material is one selected from the group consisting of Ni, Ag, Au and Cr.

In a still further preferred embodiment of the method according to the second aspect of the present invention, the first interconnection line has a single-layer structure comprising the patterned Al or Al alloy layer alone.

In a still further preferred embodiment of the method according to the second aspect of the present invention, the following steps (f') and (g') are additionally included.

(f') Forming a conductive layer beneath the Al or Al alloy layer in such a way that the conductive layer is located nearer the plate than the Al or Al alloy layer; and (g') patterning the conductive layer;

wherein the first interconnection line has a multiple-layer structure comprising the patterned Al or Al alloy layer and the patterned conductive layer stacked beneath the Al or Al alloy layer.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
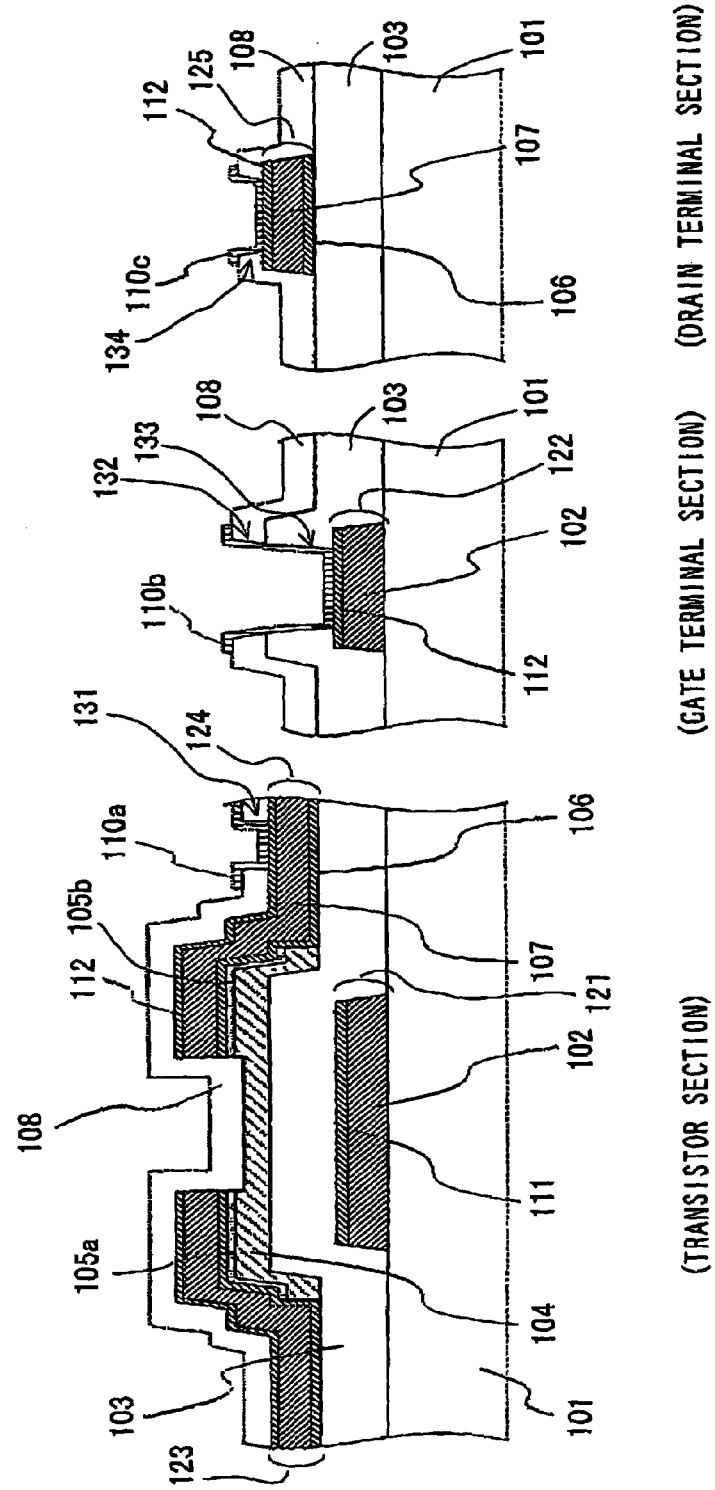
FIG. 1 is a schematic, partial cross-sectional view showing the configuration of a prior-art LCD device.

Preferred embodiments of the present invention will be described in detail below while referring to the drawings attached.

First Embodiment

Configuration of LCD Device

Figure 2:
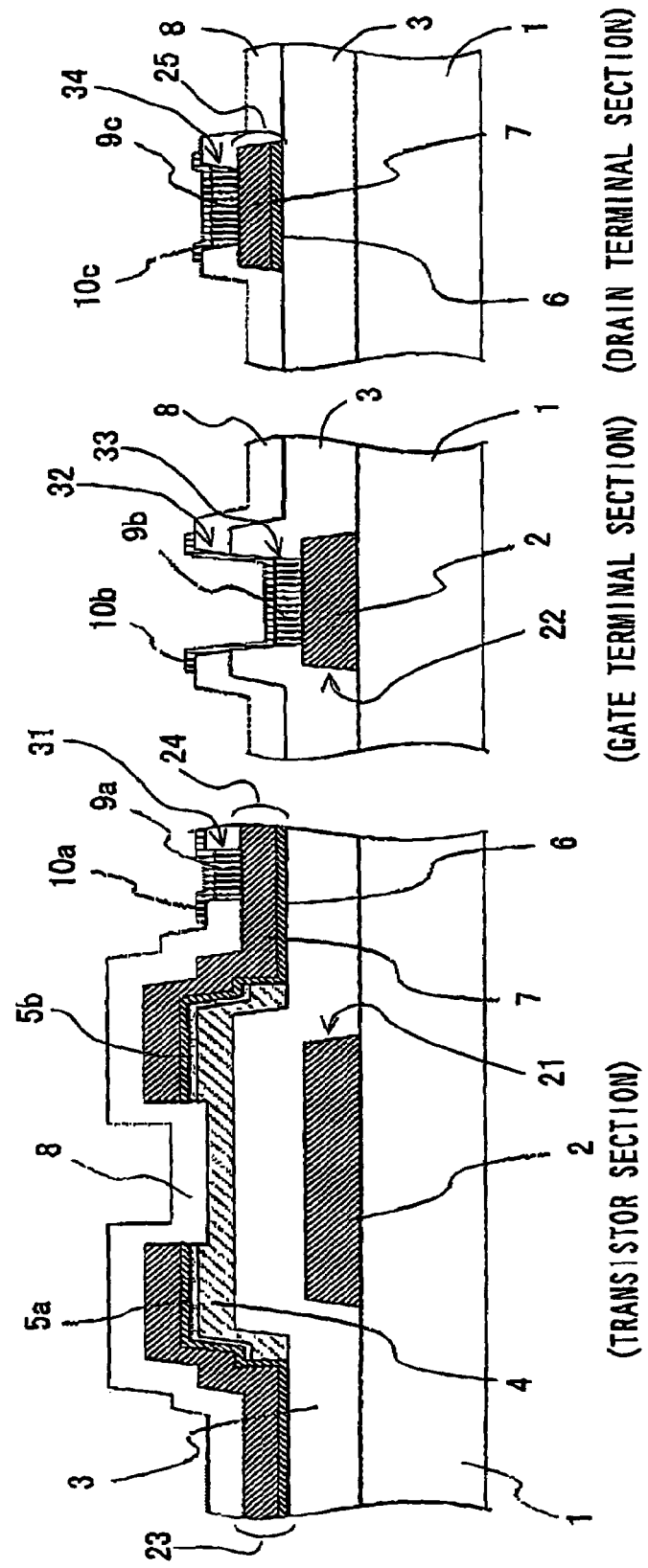
FIG. 2 is a schematic, partial cross-sectional view showing the configuration of a LCD device according to a first embodiment of the present invention.

FIG. 2 schematically shows the configuration of a LCD device with TFTs according to a first embodiment of the present invention. In FIG. 2, the structures of the transistor section including one of the TFTs, the gate terminal section of the gate electrode line connected to the gate electrode of the TFT, and the drain terminal section of the drain electrode line connected to the drain electrode of the TFT are shown.

Here, each of the TFTs has the inverted staggered structure and the etched channel structure. However, the invention is applicable to any other type or structure of the TFT having wiring or interconnection lines comprising at least patterned Al or Al alloy layer.

As shown in FIG. 2, gate electrodes 21 and gate electrode lines 22 are formed on a rectangular glass plate 1. Each of the gate electrodes 21 is formed by a patterned Al alloy layer 2 to have a single-layer structure. Each of the gate electrode lines 22 is formed by the patterned Al alloy layer 2 to have the same single-layer structure as the gate electrode 21. The gate electrode lines 22, which are united with the corresponding gate electrodes 21, extend to the corresponding gate terminal sections. The gate electrodes 21 and the gate electrode lines 22 are covered with a gate insulating layer 3 that covers the whole surface of the glass plate 1. The gate insulating layer 3 comprises contact holes 33 in the respective gate terminal sections to expose corresponding parts of the underlying gate electrode lines 22.

In each of the transistor sections, an a-Si layer is formed on the gate insulating layer 3 so as to overlap with the corresponding gate electrode 21. The a-Si layer 4 is a conductive layer to generate a channel therein. A pair of island-shaped $n^+$-type a-Si layers 5a and 5b are formed on the a-Si layer 4 to be apart from each other at a predetermined distance. A source electrode 23 and a drain electrode 24 are formed on the $n^+$-type a-Si layers 5a and 5b, respectively. The $n^+$-type a-Si layers 5a and 5b are conductive layers for improving the ohmic contact of the overlying source and drain electrodes 23 and 24 with the underlying a-Si layer 4. The source and drain electrodes 23 and 24 are located on the gate insulating layer 3 in the areas excluding the positions superposed on the $n^+$-type a-Si layers 5a and 5b.

The source electrode 23 has a two-layer structure comprising a patterned lower barrier metal layer 6 and a patterned Al alloy layer 7 stacked on the layer 6. The drain electrode 24 has a two-layer structure comprising the patterned lower barrier metal layer 6 and the patterned Al alloy layer 7. Therefore, the drain electrode 24 has the same two-layer structure as the source electrode 23.

The source electrodes 23 and the drain electrodes 24 are covered with a passivation insulating layer 8 formed over the whole surface of the glass plate 1. The passivation insulating layer 8 enters the respective gaps between the source electrodes 23 and the corresponding drain electrodes 24.

The passivation insulating layer 8 has contact holes 31, 32 and 34. The contact hole 31 is located in each of the transistor sections. The contact hole 32 is located in each of the gate terminal sections in such a way as to be superposed on the corresponding contact hole 33 of the gate insulating layer 3. The contact hole 34 is located in each of the drain terminal sections.

In each transistor section, the underlying drain electrode 24 (in other words, the Al alloy layer 7 of the drain electrode 24 as the upper part thereof) is partially exposed by way of the contact hole 31 of the passivation insulating layer 8. In each gate terminal section, the underlying gate electrode 22 (In other words, the patterned Al alloy layer 2) is partially exposed by way of the contact hole 33 of the gate insulating layer 3 and the contact hole 32 of the passivation insulating layer 8. In each drain terminal section, the underlying drain electrode line 25 (in other words, the Al alloy layer 7 of the drain electrode line 25 as the upper part thereof) is partially exposed by way of the contact hole 34 of the passivation insulating layer 8.

In each contact hole 31 of the passivation insulating layer 8, a conductive material 9a is placed. The conductive material 9a is made of a plated metal such as Ni, Ag, Au, Cr, or the like. The bottom of the conductive material 9a is in contact with the surface of the drain electrode 24 (i.e., the surface of the Al alloy layer 7) and covers the entire exposed part of the surface of the drain electrode 24 (i.e., the surface of the Al alloy layer 7). The thickness (i.e., height) of the conductive material 9a is slightly less than the depth of the contact hole 31. Therefore, the conductive material 9a is placed only in the inside of the contact hole 31, which means that the material 9a does not protrude to the outside of the hole 31.

In each contact hole 33 of the gate insulating layer 3, which is superposed on the contact hole 32 of the passivation insulating layer 8, a conductive material 9b is placed. The conductive material 9b is made of the same plated metal as the conductive material 9a. The bottom of the conductive material 9b is in contact with the surface of the gate electrode line 22 (i.e., the surface of the Al alloy layer 2) and covers the entire exposed part of the surface of the gate electrode line 22 (i.e., the Al alloy layer 2). The thickness (i.e., height) of the conductive material 9b is approximately half as much as the depth of the contact hole 33. Therefore, the top of the conductive material 9b does not reach the inside of the contact hole 32 of the passivation insulating layer 8, which means that the material 9b is placed only in the contact hole 33 and does not protrude to the outside of the hole 33.

In each contact hole 34 of the passivation insulating layer 8, a conductive material 9c is placed. The conductive material 9c is made of the same plated metal as the conductive material 9a. The bottom of the conductive material 9c is in contact with the surface of the drain electrode line 25 (i.e., the surface of the Al alloy layer 7) and covers the entire exposed part of the surface of the drain electrode line 25 (i.e., the surface of the Al alloy layer 7). The thickness (i.e., height) of the conductive material 9c is slightly less than the depth of the contact hole 34. Therefore, the conductive material 9c is placed only in the inside of the contact hole 34, which means that the material 9c does not protrude to the outside of the hole 34.

On the passivation insulating layer 8, transparent conductive layers 10a, 10b, and 10c are formed to overlap with the contact holes 31, 32, and 34, respectively, where the layers 10a, 10b, and 10c are made of ITO. Each of the transparent conductive layers 10a is formed to overlap with the corresponding contact hole 31 on the passivation insulating layer 8, where the bottom of the layer 10a is contacted with the surface of the corresponding conductive material 9a placed in the corresponding contact hole 31. In this way, each of the transparent conductive layers 10a is electrically connected by way of the corresponding conductive material 9a to the Al alloy layer 7 constituting the upper part of the corresponding drain electrode 24.

Each of the transparent conductive layers 10b is formed to overlap with the superposed contact holes 32 and 33 on the passivation insulating layer 8, where the bottom of the layer 10b is contacted with the surface of the corresponding conductive material 9b placed in the corresponding contact hole 33. In this way, each of the transparent conductive layers 10b is electrically connected by way of the corresponding conductive material 9b to the Al alloy layer 2 constituting the corresponding gate electrode line 22.

Each of the transparent conductive layers 10c is formed to overlap with the corresponding contact hole 34 on the passivation insulating layer 8, where the bottom of the layer 10c is contacted with the surface of the corresponding conductive material 9c placed in the corresponding contact hole 34. In this way, each of the transparent conductive layers 10c is electrically connected by way of the corresponding conductive material 9c to the Al alloy layer 7 constituting the upper part of the corresponding drain electrode line 25.

Method of Fabricating LCD Device

Next, a method of fabricating the LCD device according to the first embodiment of the present invention is explained below with reference to FIGS. 3 and 4.

Figure 3:
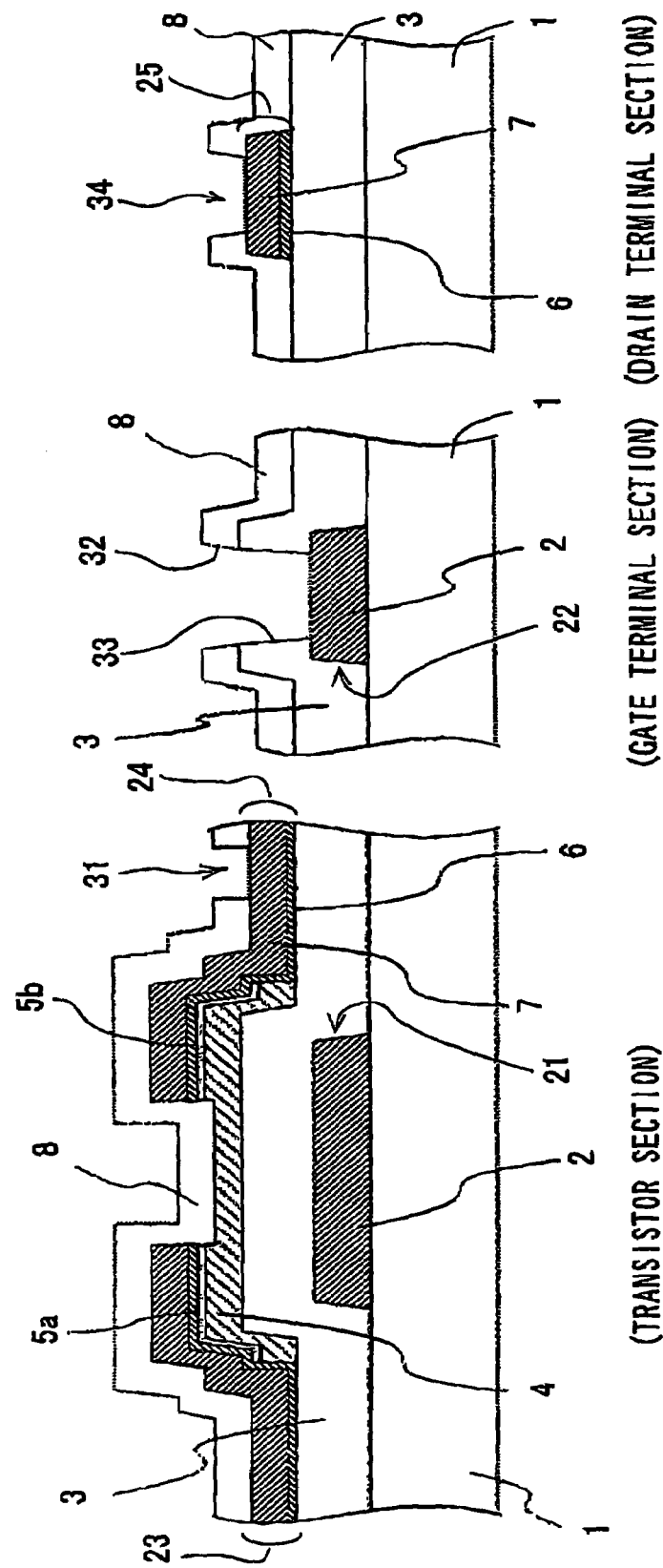
FIG. 3 is a schematic, partial cross-sectional view showing a method of fabricating the LCD device according to the first embodiment of the present invention.
Figure 4:
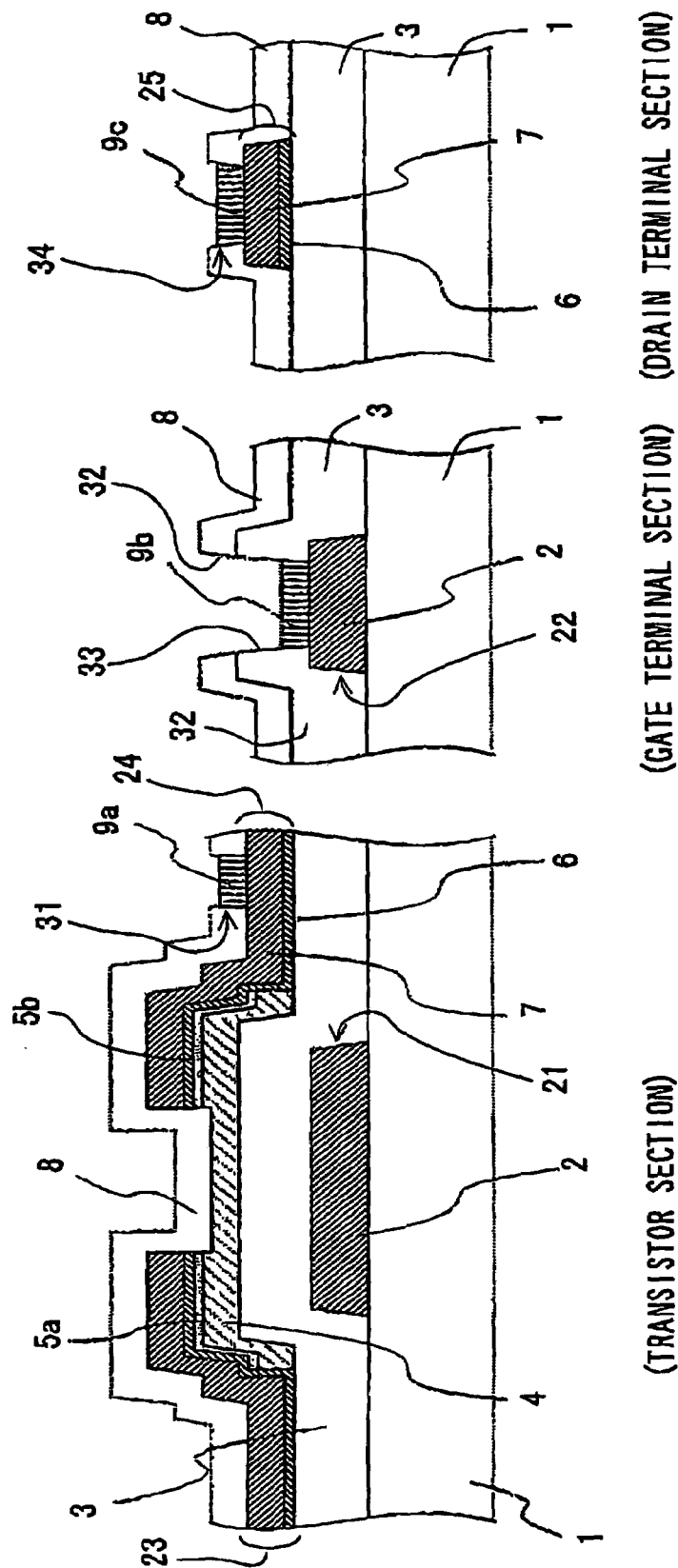
FIG. 4 is a schematic, partial cross-sectional view showing the method of fabricating the LCD device according to the first embodiment of the present invention, the state of which is subsequent to that of FIG. 3.

First, as shown in FIG. 3, an Al alloy layer is deposited by, for example, a sputtering method, directly on the rectangular glass plate 1 with a predetermined size. The thickness of the Al alloy layer thus deposited is approximately 2000 Å. Thereafter, the Al alloy layer thus deposited is patterned by using known lithography and etching techniques, thereby forming the gate electrodes 21 and the gate electrode lines 22. As the Al alloy used here, for example, Al—Nd alloy or any other Al alloy may be used if it has a good heat-resistant property and a low resistivity. The Al alloy layer 2 can be etched in a lump with tapered etching profiles if a mixture of phosphoric acid ($H_3PO_4$), nitric acid ($HNO_3$), acetic acid ($CH_3COOH$), and water is used.

Subsequently, for example, by a plasma-enhanced CVD (Chemical Vapor Deposition) method, a silicon nitride ($SiN_x$) layer with a thickness of approximately 3000 Å is formed on the whole glass plate 1 as the gate insulating layer 3. Thus, the gate electrodes 21 and the gate electrode lines 22 are covered with the gate insulating layer 3 made of $SiN_x$.

Next, for example, by a plasma-enhanced CVD method, the a-Si layer 4 (which constitutes the semiconductor layer of the TFT) with a thickness of approximately 2000 Å is formed on the gate insulating layer 3. On the a-Si layer 4 thus formed, an $n^+$-type a-Si layer with a thickness of approximately 500 Å is formed. Then, the a-Si layer 4 and the $n^+$-type a-Si layer thus formed are patterned to be island-shaped by known lithography and etching techniques, thereby forming TFT regions with a two-layered structure. At this stage, the gate insulating layer 3 is exposed in the areas other than the TFT regions.

Next, for example, by a sputtering method, the lower barrier metal layer 6 with a thickness of approximately 500 Å and the Al alloy layer 7 with a thickness of approximately 2000 Å are deposited in this order over the whole glass plate 1. Thus, the island-shaped TFT regions are covered with the stacked structure of the lower barrier metal layer 6 and the Al alloy layer 7. The said stacked structure of the layers 6 and 7 is located on the gate insulating layer 3 in the areas other than the TFT regions. As the material for the lower barrier metal layer 6, any refractory metal such as molybdenum (Mo) is preferably used. As the Al alloy for the Al alloy layer 7, Al—Nd alloy or any other Al alloy may be used if it has a good heat-resistant property and a low resistivity.

Subsequently, the stacked structure of the lower barrier metal layer 6 and the Al alloy layer 7 is patterned by known lithography and etching techniques, thereby forming the source electrodes 23 and the drain electrodes 24 in the respective transistor sections, and the source electrode lines (not shown) and the drain electrode lines 25 in the areas excluding the transistor sections. In this etching process, the lower barrier metal layer 6 and the Al alloy layer 7 can be etched in a lump with tapered etching profiles if a mixture of phosphoric acid, nitric acid, acetic acid, and water is used.

Thereafter, by using known lithography and etching techniques, the island-shaped a-Si layer 4 and the island-shaped $n^+$-type a-Si layer in each transistor section are selectively etched to expose the intervening portions (i.e., the channel regions) between the source electrode 23 and the drain electrode 24. Thus, the $n^+$-type a-Si layer in each transistor section is divided into two, resulting in the $n^+$-type a-Si layers 5a and 5b. Through the above-described process steps, the channel-etched TFTs having the structure shown in FIG. 3 are formed in the respective transistor sections.

Next, by using, for example, a plasma-enhanced CVD method, a $SiN_x$ layer with a thickness of approximately 2000 Å is deposited over the whole surface of the glass plate 1 as the passivation insulating layer 8. Thus, the source electrodes 23, the drain electrodes 24, the source electrode lines (not shown), and the drain electrode lines 25 are covered with the passivation insulating layer 8 made of $SiN_x$. At this stage, the passivation insulating layer 8 is formed to fill the respective intervening portions between the source and drain electrodes 23 and 24. Moreover, the passivation insulating layer 8 is located on the gate insulating layer 3 in the areas excluding the source electrodes 23, the drain electrodes 24, the source electrode lines, and the drain electrode lines 25.

Subsequently, by a dry etching method using, for example, a $SF_6$-system gas, and a resist film with a predetermined pattern, the passivation insulating layer 8 and the underlying gate insulating layer 3, both of which are formed by $SiN_x$, are selectively etched. Thus, the contact holes 31, 32, and 34 are formed to penetrate through the passivation insulating layer 8 and at the same time, the contact holes 33 are formed in the gate insulating layer 3. The contact holes 33 of the gate insulating layer 3 are superposed on the corresponding contact holes 32 of the passivation insulating layer 8. Therefore, it can be said that each of the contact holes 33 and a corresponding one of the contact holes 32 constitute a single contact hole penetrating through the gate insulating layer 3 and the passivation insulating layer 8. As a result, the patterned Al alloy layer 7 constituting the upper parts of the drain electrodes 24 is partially exposed by way of the contact holes 31 in the transistor sections. The patterned Al alloy layer 7 constituting the upper parts of the drain electrode lines 25 is partially exposed by way of the contact holes 34 in the drain terminal sections. The patterned Al alloy layer 2 constituting the gate electrode lines 22 is partially exposed by way of the contact holes 32 and 33 in the gate terminal sections. In addition, in this etching process of the contact holes 31, 32, 33 and 34, wet etching using buffered hydrogen fluoride (HF) or the like as an etchant may be used. The state at this stage is shown in FIG. 3.

Next, native oxide layers of Al generated respectively on the exposed surfaces of the patterned Al alloy layer 7 at the bottoms of the contact holes 31 and 34 and native oxide layers of Al generated respectively on the exposed surfaces of the patterned Al alloy layer 2 at the bottoms of the contact holes 33 are removed with an etchant such as buffered HF, phosphoric acid, or the like.

Thereafter, by a known electrolytic plating method, the conductive materials 9a are selectively formed on the exposed surfaces of the Al alloy layer 7 in the respective contact holes 31, the conductive materials 9c are selectively formed on the exposed surfaces of the Al alloy layer 7 in the respective contact holes 34, and the conductive materials 9b are selectively formed on the exposed surfaces of the Al alloy layer 7 in the respective superposed contact holes 32 and 33. The stage at this stage is shown in FIG. 4. As a metal applicable to the conductive materials 9a, 9b, and 9c, nickel (Ni), silver (Ag), gold (Au), chromium (Cr), or any other metal may be used if it has a good corrosion resistant property and a low contact resistance with the transparent conductive layers 10a, 10b, and 10c.

Here, due to the use of an electrolytic plating method, the plated metal can be selectively deposited on the exposed surfaces of the Al alloy layer 2 or 7 in the contact holes 31, 33, or 34, thereby forming the conductive materials 9a, 9b, and 9c. Moreover, by successively conducting the process of removing the native oxide layers of Al and the process of electrolytic plating in the same apparatus (or a single apparatus), the thickness of the native oxide layers of Al to be deposited on the surface of the Al alloy layer 2 or 7 can be reduced. Therefore, the contact resistance between the plated metal (i.e., the conductive materials 9a, 9b, and 9c) and the Al alloy layer 2 or 7 can be decreased furthermore.

Thereafter, ITO as a transparent conductive material is deposited on the passivation insulating layer 8 to have a thickness of approximately 500 Å by, for example, a sputtering method. Then, the transparent conductive material layer thus formed is patterned by known photolithography and etching techniques. As a result, the transparent conductive layers 10a, 10b, and 10c are formed to be overlapped with the underlying conductive materials 9a, 9b, and 9c, respectively, as shown in FIG. 2. At this time, the bottoms of the transparent conductive layers 10a, 10b, and 10c are in contact with the surfaces of the conductive materials 9a, 9b, and 9c, respectively, and therefore, the layers 10a, 10b, and 10c are electrically connected to the Al alloy layer 7 or 2 by way of the materials 9a, 9b, and 9c, respectively. In this process, the pixel electrodes (not shown) are formed by using the same transparent conductive material (i.e., ITO) on the passivation insulating layer 8 as well. The pixel electrodes thus formed are electrically connected to the corresponding source electrodes 23. As the transparent conductive layers 10a, 10b, and 10c, IZO (Indium Zinc Oxide) or the like may be used instead of ITO.

Through the above-described process steps, the LCD device according to the first embodiment of the invention shown in FIG. 2 is fabricated.

With the LCD device according to the first embodiment of the invention shown in FIG. 2, as explained above, the transparent conductive layers 10a, 10b, and 10c are not in direct contact with the Al alloy layer 7 constituting the upper part of the drain electrodes 24, the Al alloy layer 2 constituting the gate electrodes 22, and the Al alloy layer 7 constituting the upper part of the drain electrode lines 25. Therefore, electrochemical reactions caused by the developing or etching solution used for forming the layers 10a, 10b, and 10c are suppressed. This means that the corrosion of the transparent conductive layers 10a, 10b, and 10c is prevented.

Moreover, since the conductive materials 9a, 9b, and 9c are respectively placed between the transparent conductive layers 10a, 10b, and 10c and the Al alloy layer 2 or 7 contact resistance between the transparent conductive layers 10a, 10b, and 10c and the Al alloy layer 2 or 7 does not increase.

Furthermore, the conductive materials 9a and 9c are in contact with the exposed portions of the Al alloy layer 7 in the contact holes 31 and 34 of the passivation insulating layer 8 and are formed to entirely cover the said exposed portions. The conductive materials 9b are in contact with the exposed portions of the Al alloy layer 2 in the contact holes 33 of the gate insulating layer 3 and are formed to entirely cover the said exposed portions. The conductive materials 9a and 9c are located only in the inside of the contact holes 31 and 34 and do not protrude to the outside of the contact holes 31 and 34. The conductive materials 9b are located only in the inside of the contact holes 33 and do not protrude to the outside of the contact holes 33. Therefore, this interconnection structure is apparently different from the prior-art interconnection structure shown in FIG. 1 and thus, the above-described first disadvantage of "the step coverage degradation due to the thickness increase of the interconnection line itself" does not occur.

Because of a similar reason to the above, regarding the drain electrodes 24 and the drain electrode lines 25, the lower barrier metal layer 6 and the Al alloy layer 7 are patterned by etching while the conductive materials 9a and 9c are not etched or patterned. Therefore, the above-described second disadvantage of "the step coverage degradation due to the generation of undercut portions" does not occur. Regarding the gate electrode lines 22, similarly, only the Al alloy layer 2 is patterned by etching while the conductive materials 9b are not etched or patterned. Therefore, the above-described second disadvantage does not occur regarding the gate electrode lines 22 as well.

Since the conductive materials 9a, 9b, and 9c are made of plated metals that can be formed by a known electrolytic plating method, it is unnecessary to prepare any process or reaction chamber for a CVD or sputtering method in order to form the conductive materials 9a, 9b, and 9c. Thus, the above-described third disadvantage of "productivity deterioration and fabrication cost increase" does not occur, too.

Additionally, the conductive materials 9a, 9b, and 9c are made of plated metals (e.g., Ni) with a good corrosion resistant property against the environment of the LCD device according to the first embodiment of the invention. Therefore, the connection reliability of the gate terminal sections and the drain terminal sections that are likely to be exposed to various severe environments is improved. As a result, the operation reliability of the said LCD device itself is improved as well.

Second Embodiment

Figure 5:
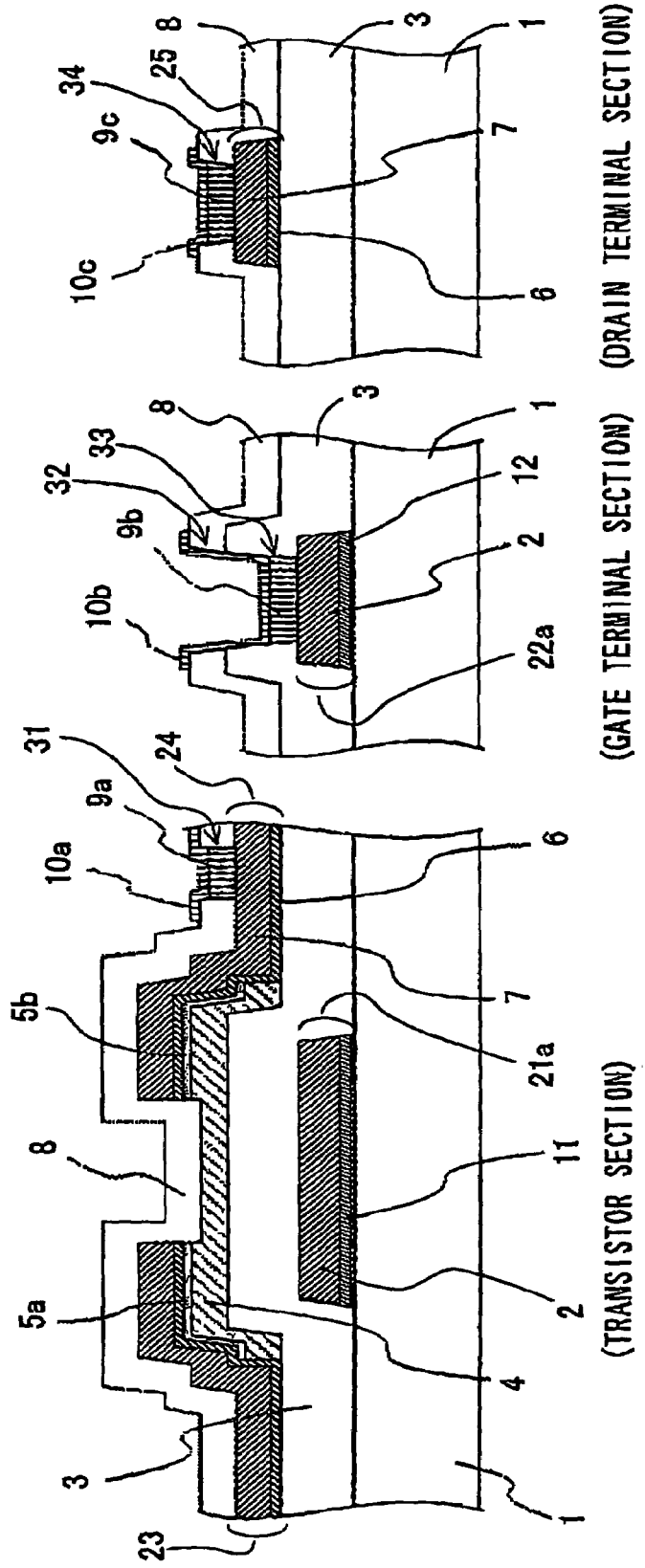
FIG. 5 is a schematic, partial cross-sectional view showing the configuration of a LCD device according to a second embodiment of the present invention.

FIG. 5 schematically shows the configuration of a LCD device with TFTs according to a second embodiment of the present invention. In FIG. 5, similar to FIG. 2, the structures of the transistor section including one of the TFTs, the gate terminal section of the gate electrode line connected to the gate electrode of the TFT, and the drain terminal section of the drain electrode line connected to the drain electrode of the TFT are shown.

The configuration of the LCD device according to the second embodiment is the same as the LCD device according to the above-described first embodiment of FIG. 2, except that gate electrodes 21a and gate electrode lines 22a have a two-layer structure comprising an Al layer and a conductive barrier layer (a lower barrier layer) made of tungsten (W) or the like stacked beneath the Al layer. Therefore, explanation about the same configuration is omitted here for simplification by respectively attaching the same reference numerals to the same elements in FIG. 5 as those in FIG. 2.

In FIG. 5, the gate electrodes 21a and the gate electrode lines 22a are equal in structure and thickness to each other, because both of them are formed by patterning the two-layer structure comprising the Al layer 2 and the lower barrier layer 11 or 12. However, the thickness of the gate electrodes 21a and the gate electrode lines 22a are equal to the gate electrodes 21 and the gate electrode lines 22 in the first embodiment, where the gate electrodes 21 and the gate electrode lines 22 have the single-layer structure comprising the Al alloy layer. This means that the thickness of the gate electrodes 21a and the gate electrode lines 22a is less than that of the gate electrodes 21 and the gate electrode lines 22 by the value corresponding to the thickness of the lower barrier layer 11 or 12. Therefore, the above-described first disadvantage (i.e., the step coverage degradation due to the thickness increase of the gate electrodes 21a and the gate electrode lines 22a does not occur.

A method of fabricating the LCD device according to the second embodiment is the same as that of the LCD device according to the first embodiment of FIG. 2, except that the steps of forming the lower barrier layer 11 or 12 and patterning them are added.

With the LCD device according to the second embodiment, it is apparent that the same advantages as those of the LCD device according to the first embodiment of FIG. 2 are obtainable.

Variations

The above-described embodiment is embodied examples of the present invention. Therefore, it is needless to say that the present invention is not limited to the embodiments. Any other modification is applicable to the embodiments and their variations.

For example, in the above-described first embodiment of the invention, the gate electrodes and the gate electrode lines are formed by patterning an Al alloy layer only, and the drain electrodes and the drain electrode lines have a two-layer structure comprising a lower barrier metal layer and an Al alloy layer. However, the invention is not limited to this. It is needless to say that an Al layer may be used instead of the Al alloy layer, in other words, the gate electrodes and the gate electrode lines may be formed by patterning an Al layer.

In addition, for example, the gate electrodes and the gate electrode lines may be formed by an Al alloy layer or Al layer alone, and the drain electrodes and the drain electrode lines may be formed by only a layer of a refractory metal such as Cr, Mo, or the like. The gate electrodes and the gate electrode lines may have a multiple-layer structure comprising a lower barrier metal layer and an Al or Al alloy layer. The drain electrodes and the drain electrode lines may be formed by only an Al or Al alloy layer.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A liquid-crystal display device comprising:
a first interconnection line comprising a patterned Al or Al alloy layer, disposed directly on an insulating plate or over the plate by way of an underlying insulating layer;

a first insulating layer formed on the plate to cover the first interconnection line, the first insulating layer having a contact hole that exposes a part of the first interconnection line;

a first conductive material made of a plated metal, the first conductive material being in contact with the exposed part of the first interconnection line in the contact hole in such a way as to cover the whole exposed part thereof; and a first transparent conductive layer in contact with the first conductive material;

wherein the first transparent conductive layer is electrically connected to the first interconnection line by way of the first conductive material.

2. The device according to claim 1, wherein the first conductive material is disposed only in the contact hole of the first insulating layer.

3. The device according to claim 1, wherein the first interconnection line is a gate electrode line.

4. The device according to claim 1, wherein the first conductive material is less in width than the first interconnection line.

5. The device according to claim 4, wherein a bottom of the first conductive material is in a same plane as that of the contact hole.

6. The device according to claim 1, wherein the first conductive material is one selected from the group consisting of Ni, Ag, Au and Cr.

7. The device according to claim 1, wherein the first interconnection line has a single-layer structure comprising a patterned Al or Al alloy layer.

8. The device according to claim 1, wherein the first interconnection line has a multiple-layer structure comprising a patterned Al or Al alloy layer and a patterned conductive layer stacked beneath the Al or Al alloy layer; and the patterned conductive layer is located nearer the plate than the patterned Al or Al alloy layer.

9. The device according to claim 1, further comprising:

a second interconnection line formed by a patterned Al or Al alloy layer, disposed on the first insulating layer;

a second insulating layer formed on the first insulating layer to cover the second interconnection line, the second insulating layer having a contact hole that exposes a part of the second interconnection line;

a second conductive material made of a plated metal, the second conductive material being in contact with the exposed part of the second interconnection line in the contact hole in such a way as to cover the whole exposed part thereof; and a second transparent conductive layer in contact with the second conductive material;

wherein the second transparent conductive layer is electrically connected to the second interconnection line by way of the second conductive material.

10. The device according to claim 9, wherein the first interconnection line is a gate electrode line and the second interconnection line is a drain electrode line.

11. The device according to claim 9, wherein the second conductive material is one selected from the group consisting of Ni, Ag, Au and Cr.

12. A method of fabricating a LCD device, comprising the steps of:

forming an Al or Al alloy layer directly on an insulating plate or over the plate by way of an underlying insulating layer:

patterning the Al or Al alloy layer to form a first interconnection line;

forming a first insulating layer on the plate to cover the first interconnection line;

selectively etching the first insulating layer to form a contact hole that exposes a part of the first interconnection line;

depositing a metal in the contact hole of the first insulating layer by a plating method, thereby forming a first conductive material in contact with the exposed part of the first interconnection line in such a way as to cover the whole exposed part thereof; and forming a first transparent conductive layer on the first conductive material to be in contact therewith, thereby electrically connecting the first transparent conductive layer to the first interconnection line by way of the first conductive material.

13. The method according to claim 12, wherein the first conductive material is disposed only in the contact hole of the first insulating layer.

14. The method according to claim 12, wherein a gate electrode line is formed by the first interconnection line.

15. The method according to claim 12, wherein the first conductive material is less in width than the first interconnection line.

16. The method according to claim 12, wherein the first conductive material is one selected from the group consisting of Ni, Ag, Au and Cr.

17. The method according to claim 12, wherein an electrolytic plating method is used as the plating method.

18. The method according to claim 12, further comprising the steps of:

forming a second interconnection line on the first insulating layer by a patterned Al or Al alloy layer;

forming a second insulating layer on the first insulating layer to cover the second interconnection line;

selectively etching the second insulating layer to have a contact hole that exposes a part of the second interconnection line:

depositing a metal in the contact hole of the second insulating layer by a plating method, thereby forming a second conductive material to be in contact with the exposed part of the second interconnection line in the contact hole in such a way as to cover the whole exposed part thereof; and forming a second transparent conductive layer on the second conductive material to be in contact therewith, thereby electrically connecting the second transparent conductive layer to the second interconnection line by way of the second conductive material.

19. The method according to claim 18, wherein the first interconnection line is a gate electrode line and the second interconnection line is a drain electrode line.

20. The method according to claim 18, wherein the second conductive material is one selected from the group consisting of Ni, Ag, Au and Cr.

21. The method according to claim 12, wherein the first interconnection line has a single-layer structure comprising the patterned Al or Al alloy layer alone.

22. The method according to claim 12, further comprising the steps of:

forming a conductive layer beneath the Al or Al alloy layer in such a way that the conductive layer is located nearer the plate than the Al or Al alloy layer; and patterning the conductive layer;

wherein the first interconnection line has a multiple-layer structure comprising the patterned Al or Al alloy layer and the patterned conductive layer stacked beneath the Al or Al alloy layer.

* * * * *